(12) United States Patent
Hokugou et al.

(10) Patent No.: US 8,917,501 B2
(45) Date of Patent: Dec. 23, 2014

(54) ELECTRONIC DEVICE

(71) Applicant: Fujitsu Limited, Kawasaki (JP)

(72) Inventors: Kazuo Hokugou, Kawasaki (JP); Ikki Tatsukami, Tama (JP); Daisuke Mihara, Kawasaki (JP); Hirohisa Nakabayashi, Takarazuka (JP)

(73) Assignee: Fujitsu Limited, Kawasaki (JP)

( * ) Notice: Subject to any disclaimer, the term of this patent is extended or adjusted under 35 U.S.C. 154(b) by 204 days.

(21) Appl. No.: 13/709,686

(22) Filed: Dec. 10, 2012

(65) Prior Publication Data

US 2013/0286561 A1 Oct. 31, 2013

(30) Foreign Application Priority Data

Apr. 25, 2012 (JP) ................... 2012-100413

(51) Int. Cl.
*G06F 1/16* (2006.01)
*H05K 5/02* (2006.01)
(52) U.S. Cl.
CPC .................... *H05K 5/0226* (2013.01)
USPC ..................... 361/679.27; 16/325; 248/124.1; 455/575.3
(58) Field of Classification Search
USPC ............... 455/566, 575.4, 575.3, 556.1, 90.3, 455/575.1, 557; 361/679.01, 679.27, 361/679.04, 679.48, 679.09, 679.26, 361/679.02, 679.28, 679.11, 679.15, 361/679.54, 679.46, 679.23, 679.06, 361/679.08, 679.56; 16/367, 337, 221, 384, 16/382, 371, 325, 347, 334; 312/327, 326, 312/319, 296, 223.1, 323; 248/688, 176.3, 248/124.1, 351, 70, 206.5, 301, 541; 345/205, 207, 173, 156, 659, 102, 698, 345/600, 660, 211, 99, 100
See application file for complete search history.

(56) References Cited

U.S. PATENT DOCUMENTS

| | | | |
|---|---|---|---|
| 8,146,207 B2 * | 4/2012 | Hung et al. | ..................... 16/367 |
| 2014/0063700 A1 * | 3/2014 | Kawada et al. | .......... 361/679.01 |
| 2014/0063701 A1 * | 3/2014 | Kawada et al. | .......... 361/679.01 |

FOREIGN PATENT DOCUMENTS

| | | |
|---|---|---|
| JP | 05-108202 A | 4/1993 |
| JP | 5-66725 U | 9/1993 |
| JP | 3071509 U | 6/2000 |

* cited by examiner

*Primary Examiner* — Hung Duong
(74) *Attorney, Agent, or Firm* — Westerman, Hattori, Daniels & Adrian, LLP

(57) ABSTRACT

An electronic device includes: a first housing that includes a first surface in which an operation portion, a hinge mechanism, and a removable cover are provided, and a second housing that is supported rotatally about an axis perpendicular to the first surface by the hinge mechanism and that is rotated between a position where the second housing faces the cover and a position where the second housing recedes from the cover.

7 Claims, 5 Drawing Sheets

ELECTRONIC DEVICE

CROSS-REFERENCE TO RELATED APPLICATIONS

This application is based upon and claims the benefit of priority of the prior Japanese Patent Application No. 2012-100413, filed on Apr. 25, 2012, the entire contents of which are incorporated herein by reference.

FIELD

The embodiments discussed herein are related to an electronic device.

BACKGROUND

For example, there is known an electronic device in which a housing is provided with a removable cover for replacing a part or checking the inside of the housing. Such an electronic device is disclosed in Japanese Laid-open Utility Model Publication No. 5-66725, Japanese Laid-open Patent Publication No. 5-108202, and Japanese Registered Utility Model No. 3071509.

Depending on the position where a cover is provided, it might be difficult for a user to remove the cover.

SUMMARY

According to an aspect of the embodiments, an electronic device includes: a first housing that includes a first surface in which an operation portion, a hinge mechanism, and a removable cover are provided, and a second housing that is supported rotatally about an axis perpendicular to the first surface by the hinge mechanism and that is rotated between a position where the second housing faces the cover and a position where the second housing recedes from the cover.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
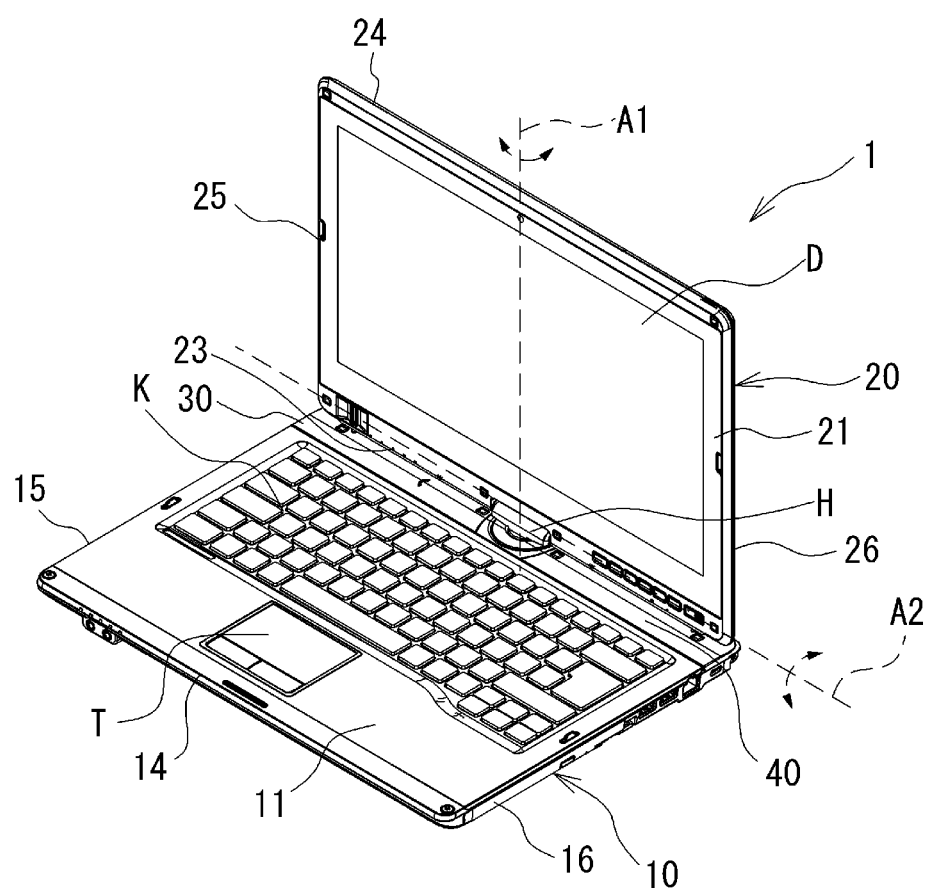
FIG. 1 is an explanatory view of a notebook computer according to the present embodiment.

A notebook computer will be described as an example of an electronic device. FIG. 1 is an explanatory view of a notebook computer 1 according to the present embodiment. The notebook computer 1 includes housings 10 and 20. The housings 10 and 20 are connected with each other by a two-axis hinge H. The housings 10 and 20 are examples of first and second housings, respectively. The two-axis hinge H is an example of a hinge mechanism. The housing 10 includes a top surface 11, and a bottom surface opposed to the top surface 11. The top surface 11 is an example of a first surface. The housing 10 has a substantially rectangular shape and includes sides 13 to 16. The sides 13 and 14 face each other and are parallel with each other. The sides 15 and 16 face each other and are parallel with each other. The sides 13 and 14 are perpendicular to the sides 15 and 16, respectively. Additionally, the side 13 is behind the housing 20 in FIG. 1.

A keyboard K and a touch pad T for operating the notebook computer 1, covers 30 and 40, and the two-axis hinge H are provided in the top surface 11. The keyboard K and the touch pad T are examples of operation portions. A motherboard for controlling the whole operation of the notebook computer 1 is housed within the housing 10. The covers 30 and 40, and the two-axis hinge H are provided along the side 13. The two-axis hinge H is provided at the center of the side 13. The two-axis hinge H is closer to the side 13 than the sides 14 to 16. The cover 30 is provided between the two-axis hinge H and the side 15. The cover 40 is provided between the two-axis hinge H and the side 16. The cover 30 is an example of a removable cover. The cover 40 is an example of another removable cover.

The housing 20 includes a front surface 21 and a rear surface 22 opposed to the front surface 21. A display D for displaying images is provided at the front surface 21. The housing 20 has a substantially rectangular shape and includes sides 23 to 26. The sides 23 and 24 face each other and are parallel with each other. The sides 25 and 26 face each other and are parallel with each other. The sides 23 and 24 are perpendicular to the sides 25 and 26, respectively.

The two-axis hinge H causes the housings 10 and 20 to rotatably connected with each other about two different axes A1 and A2. The axes A1 and A2 are perpendicular to each other. The axis A1 is perpendicular to the top surface 11. The axis A2 is included in a plane including the top surface 11.

When the housing 20 is rotated about the axis A2 from a state where the top surface 11 and the front surface 21 overlap each other, the Keyboard K and the display D are exposed as illustrated in FIG. 1. In general, a user uses the notebook computer 1 in this state. Additionally, the sides 13 and 23 are parallel with each other in the state illustrated in FIG. 1. Thus, the housing 20 faces the covers 30 and 40.

Figure 2:
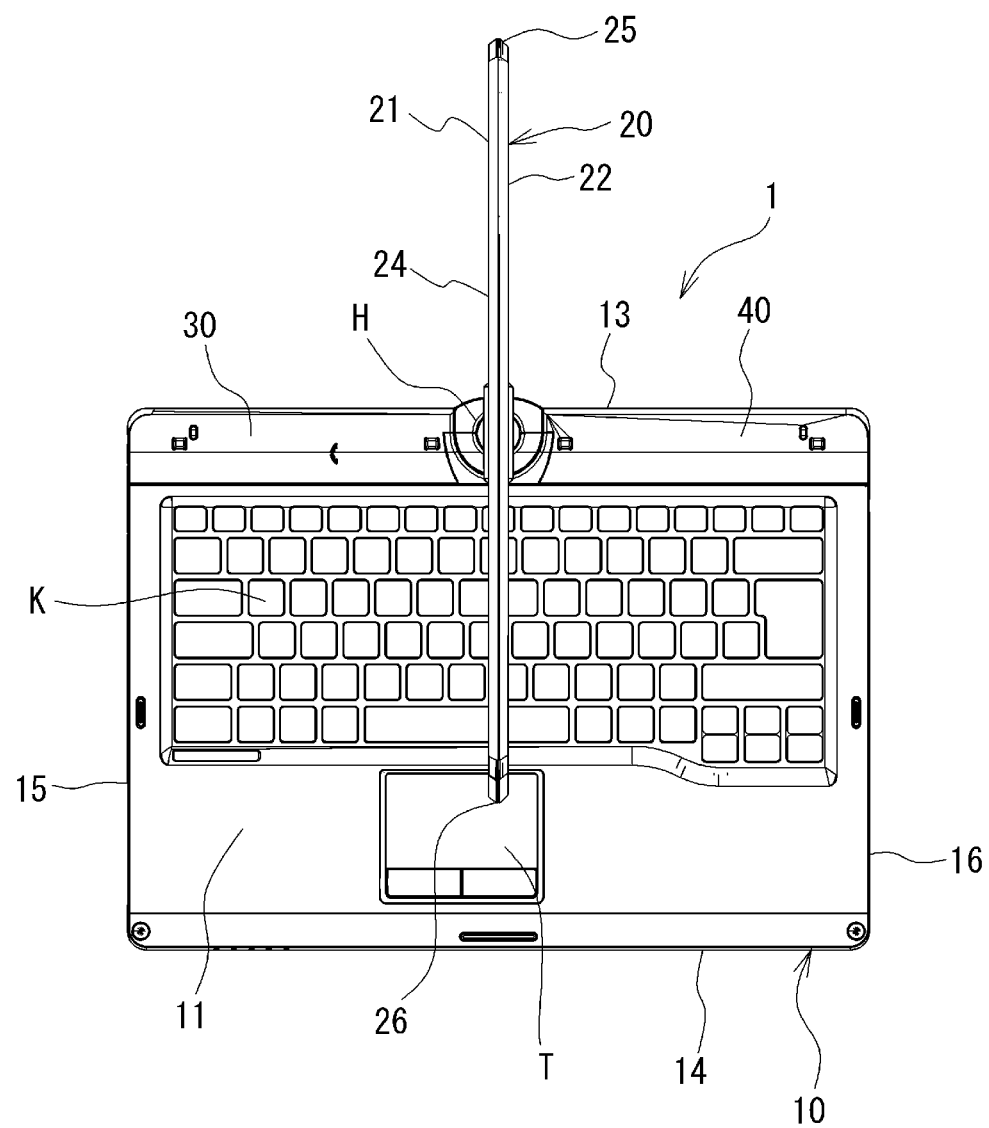
FIG. 2 is an explanatory view of the work of removing a cover.
Figure 3:
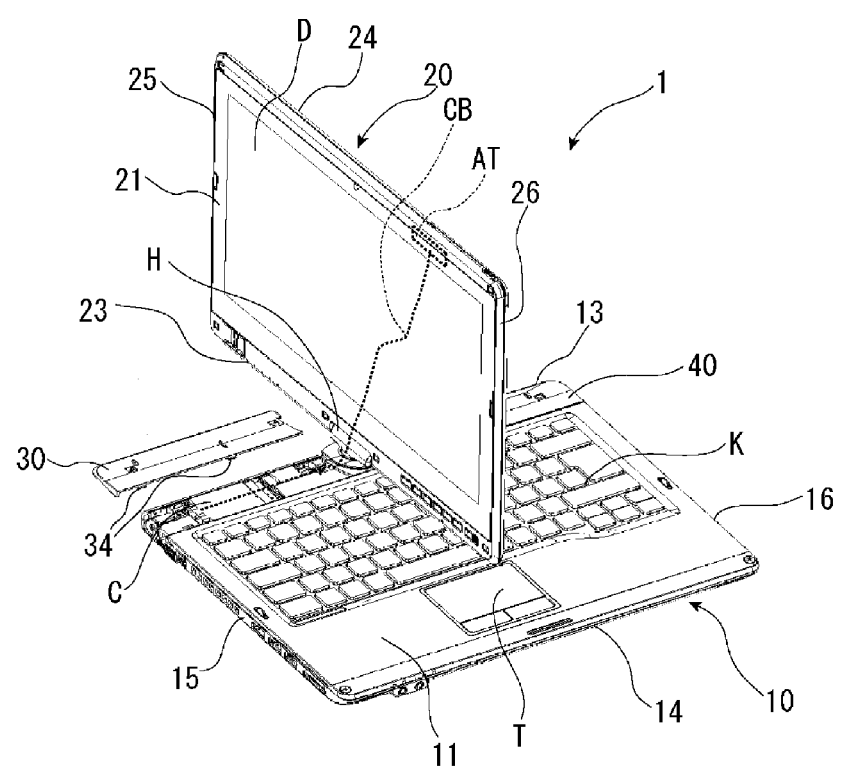
FIG. 3 is an explanatory view of the work of removing the cover.
Figure 4:
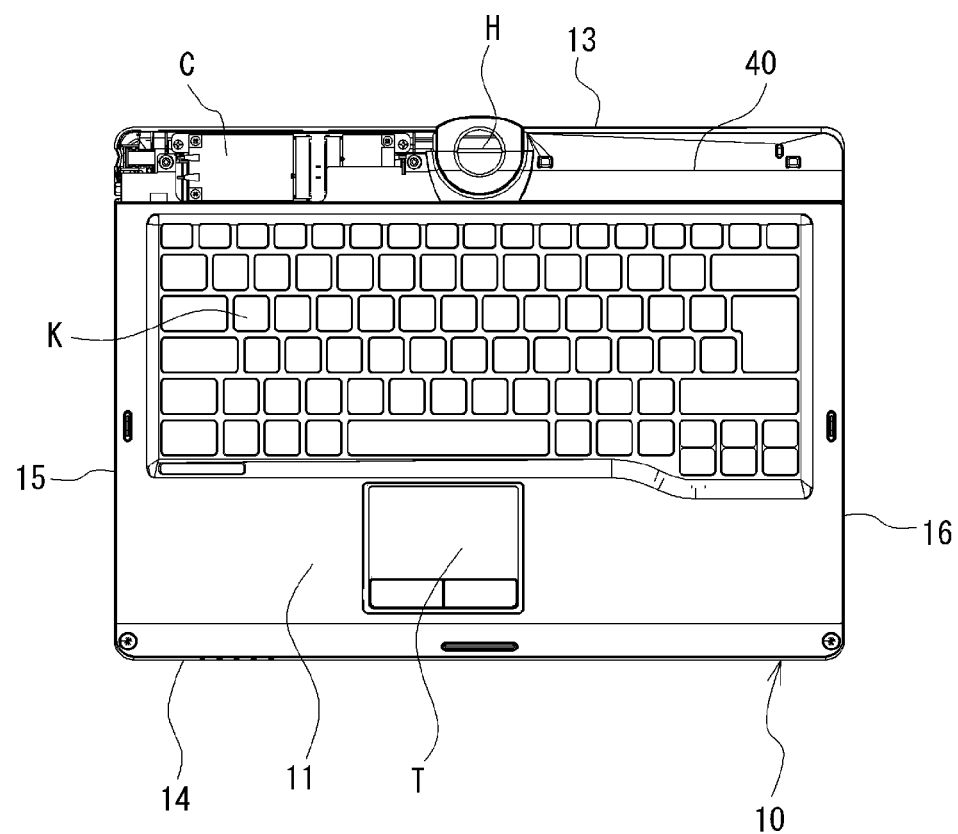
FIG. 4 is a view of a state where the cover is removed.

Next, a description will be given of the work of removing the covers 30 and 40. FIGS. 2 and 3 are explanatory views of the work of removing the covers 30 and 40. As illustrated in FIG. 2, the housing 20 is rotated about the axis A1 to recede from the covers 30 and 40. Therefore, a user can access and remove the covers 30 and 40 from the housing 10 as illustrated in FIG. 3. The cover 30 is fixed to the housing 10 by a screw. The cover 30 is provided with claw portions 34 engaging with a portion of the housing 10. Also, the cover 40 has the same structure. FIGS. 3 and 4 illustrate the state where the cover 30 is removed. Additionally, FIG. 4 illustrates only the housing 10.

A communication card C is housed within the housing 10 at the position covered with the cover 30. This communication card C is connected with a connector provided in the housing 10. This connector is connected with a cable CB routed within the housings 10 and 20 as illustrated in FIG. 3. The cable CB is routed at the backside of the display D in the housing 20 through the two-axis hinge H. An antenna AT is provided near the side 24 within the housing 20. The cable CB is electrically connected with the antenna AT. That is, the communication card C housed within the housing 10 is electrically connected with the antenna AT. The communication card C is removable from the housing 10 and exchangeable. The communication card C is an example of a part. The antenna AT is an example of another part. Additionally, such a communication card is not housed at the cover 40 side.

As mentioned above, the covers 30 and 40 are provided in the housing 10 at the top surface 11 in which the keyboard K and the touch pad T accessed by a user are provided. Thus, by rotating the housing 20 away from the covers 30 and 40, a user can access the covers 30 and 40 with ease. Therefore, it can be easy to remove the covers 30 and 40 and to exchange, attach, and detach the communication card C.

For example, in a case where a cover is provided at the bottom surface of the housing 10, a user has to turn the housing 10 down to access the cover. This work is inconvenient. In the present embodiment, a user does not have to turn the housing 10 down, since the covers 30 and 40 are provided at the top surface 11 in which the keyboard K operated by the user is provided.

For example, in a case where such a cover is provided at the bottom surface to overlap the keyboard K, the part also overlaps the keyboard K, so that the thickness of the housing 10 might increase. In the present embodiment, the covers 30 and 40 are provided in the top surface 11 at an area distanced from the keyboard K and the touch pad T, thereby suppressing the thickness of the housing 10.

The cover 30 is provided near the two-axis hinge H, and the communication card C is housed at the position covered with the cover 30. Thus, this communication card C is housed near the two-axis hinge H. This makes it possible to shorten the length of the cable CB which connects the communication card C with the antenna AT housed in the housing 20. Also, the cost is reduced. Further, the performance of the antenna AT can be improved by shortening the cable CB.

The covers 30 and 40 are provided at the top surface 11 in which the keyboard K accessed by a user is provided. However, the covers 30 and 40 are provided at the position which is not generally accessed by a user in the normal use manner illustrated in FIG. 1. Thus, the covers 30 and 40 are provided at the position which does not influence the area of the keyboard K and the touch pad T occupied in the top surface 11. This ensures the area of the keyboard K and the touch pad T.

Figure 5:
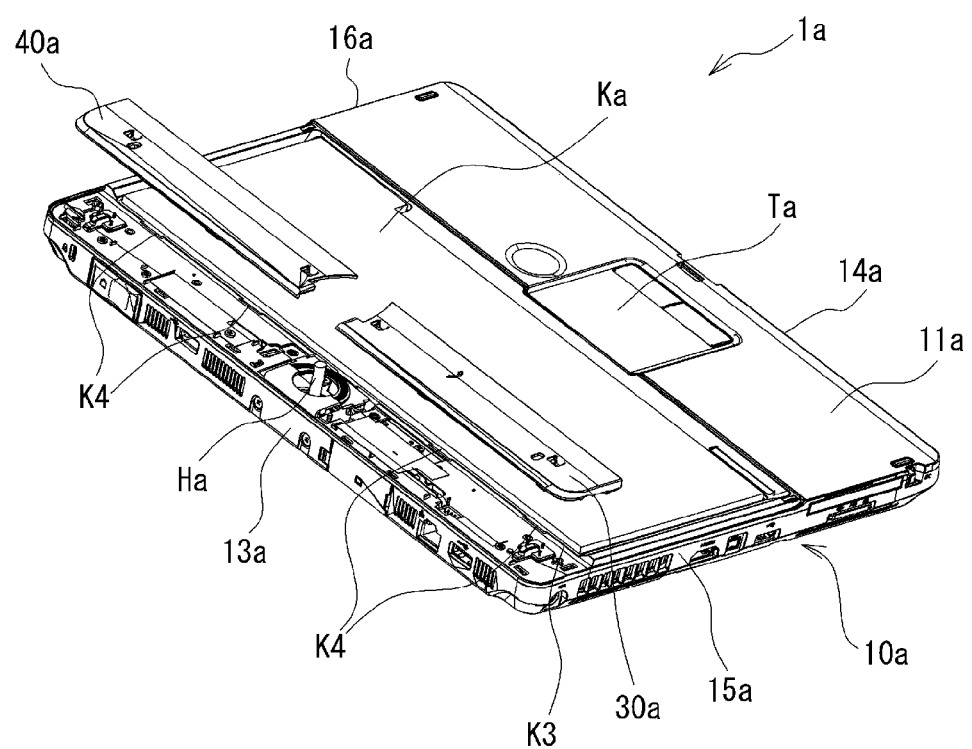
FIG. 5 is an explanatory view of a notebook computer according to a variation.

FIG. 5 is an explanatory view of a notebook computer 1a according to a variation. In the notebook computer 1a, components that are similar to those of the notebook computer 1 will be denoted by the similar reference numerals, and a detailed description of such components will be omitted. FIG. 5 illustrates only a housing 10a. A keyboard Ka of the notebook computer 1a is held by covers 30a and 40a attached to the housing 10a. Specifically, the keyboard Ka has a substantially rectangular shape and has a side K3 substantially parallel with a side 13a of the housing 10a. In the side K3, plural projections K4 protruding to the side 13a are formed at even intervals. The covers 30a and 40a are attached to the housing 10 to hold the projections K4 of the keyboard Ka. Thus, the Keyboard Ka is fixed to the housing 10a. Therefore, when the covers 30a and 40a are removed from the housing 10a, the keyboard Ka can be removed from the housing 10a. The keyboard Ka can be removed with ease to improve the exchanging work and the maintenance characteristics.

The notebook computer has been described as an example of an electronic device. However, an electronic device is not limited to this. For example, an electronic device may be a portable device such as a mobile phone, a mobile television, an electronic dictionary, a PDA, a gaming machine, a camera, a music player, and a navigation device. An electronic device may be a stationary electronic device such as a monitor, a monitor in which a computer is installed, a television, an audio device, an electric fan, and another household electrical appliance.

The communications card C has been described as an example of a part. However, a part is not limited to this. A part may be a recording medium such as a memory, and a hard disk.

The keyboard K and the touch pad T have been described as examples of operation portions. However an operation portion is not limited to this. An operation portion may be any one of a single key, plural keys, a ten-key, a touch display, a touch panel, a track ball, a lever, a button, a switch, a knob, and a wheel. An operation portion has only to be operated by a use to instruct an electronic device.

The embodiment in which two covers 30 and 40 are provided has been described. However, any one of the covers 30 and 40 may be provided. Also, plural covers may be provided along the side 13 between the two-axis hinge H and the side 15. Plural covers may be provided along the side 13 between the two-axis hinge H and the side 16.

The two-axis hinge H has been described as an example of a hinge mechanism. However, a hinge mechanism is not limited to this. A hinge mechanism has only to support the housing 20 for rotation about the axis perpendicular to the top surface 11.

The cable CB may be any one of a single cable, jointed plural cables, a flat cable, and a flexible print cable.

The antenna AT has been described as an example of another part. However, another part is not limited to this.

All examples and conditional language recited herein are intended for pedagogical purposes to aid the reader in understanding the invention and the concepts contributed by the inventor to furthering the art, and are to be constructed as being without limitation to such specifically recited examples and conditions, nor does the organization of such examples in the specification relate to a showing of the superiority and inferiority of the invention. Although the embodiment of the present inventions has been described in detail, it should be understood that the various changes, substitutions, and alterations could be made hereto without departing from the sprit and scope of the invention.

What is claimed is:

1. An electronic device comprising:
    a first housing that includes a first surface in which an operation portion, a hinge mechanism, and a removable cover are provided, and
    a second housing that is supported rotatally about an axis perpendicular to the first surface by the hinge mechanism and that is rotated between a position where the second housing faces the cover and a position where the second housing recedes from the cover.

2. The electronic device of claim 1, wherein
    the first surface includes first and second sides that intersect with each other,
    the hinge mechanism is closer to the first side than the second side, and
    the cover is provided along the first side between the second side and the hinge mechanism.

3. The electronic device of claim 1, wherein the first housing is able to house a part at a position covered with the cover.

4. The electronic device of claim 3, wherein the part housed in the first housing is electrically connected to another part provided in the second housing through a cable.

5. The electronic device of claim 1, wherein the cover holds the operation portion attached to the first housing when the cover is attached to the first housing.

6. The electronic device of claim 1, wherein
    the first surface includes a third side that intersects with the first side and that faces the second side, and another removable cover is provided along the first side between the hinge mechanism and the third side.

7. The electronic device of claim 1, wherein the second housing is supported rotatably about another axis perpendicular to the axis by the hinge mechanism.

* * * * *